(12) United States Patent
Rivers et al.

(10) Patent No.: US 8,589,762 B2
(45) Date of Patent: Nov. 19, 2013

(54) ADAPTIVE MULTI-BIT ERROR CORRECTION IN ENDURANCE LIMITED MEMORIES

(75) Inventors: Jude A. Rivers, Cortlandt Manor, NY (US); Vijayalakshmi Srinivasan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 13/176,092

(22) Filed: Jul. 5, 2011

(65) Prior Publication Data
US 2013/0013977 A1 Jan. 10, 2013

(51) Int. Cl.
*G11C 29/00* (2006.01)
(52) U.S. Cl.
USPC .................................................. 714/763
(58) Field of Classification Search
None
See application file for complete search history.

(56) References Cited

U.S. PATENT DOCUMENTS

| | | | |
|---|---|---|---|
| 3,893,071 A * | 7/1975 | Bossen et al. | 714/765 |
| 5,291,498 A | 3/1994 | Jackson et al. | |
| 6,035,432 A | 3/2000 | Jeddeloh | |
| 6,848,063 B2 | 1/2005 | Rodeheffer et al. | |
| 7,200,770 B2 | 4/2007 | Hartwell et al. | |
| 7,478,307 B1 | 1/2009 | Wong et al. | |
| 7,925,961 B2 | 4/2011 | Huang | |
| 8,347,187 B2 * | 1/2013 | Yang et al. | 714/774 |
| 2005/0144360 A1 | 6/2005 | Bennett et al. | |
| 2008/0301256 A1 | 12/2008 | McWilliams et al. | |
| 2011/0051520 A1 | 3/2011 | Kim | |
| 2011/0119456 A1 | 5/2011 | Ipek et al. | |
| 2012/0278682 A1 * | 11/2012 | Yang et al. | 714/763 |

OTHER PUBLICATIONS

International Search Report and Written Opinion dated Jun. 27, 2012 issued in International Application No. PCT/US12/33021.
Seong, N.H. et al., "SAFER: Stuck-At-Fault Error Recovery for Memories" 43rd International Symposium on Microarchitecture, Proceedings (Dec. 2010).
Eckhardt, D.A. et al., "A Trace-Based Evaluation of Adaptive Error Correction for a Wireless Local Area Network" Mobile Networks and Applications (1999) pp. 273-287, vol. 4.
Levine, B. et al., "Implementation of Near Shannon Limit Error-Correcting Codes Using Reconfigurable Hardware" IEEE Symposium on Field-Programmable Custom Computing Machines (2000).

* cited by examiner

*Primary Examiner* — Guerrier Merant
(74) *Attorney, Agent, or Firm* — Scully, Scott, Murphy & Presser, P.C.; William Stock, Esq.

(57) ABSTRACT

Multi-bit stuck-at fault error recovery can be enabled by adaptive multi-bit error correction method, in which the overhead of error correction hardware is reduced without affecting the lifetime of the memory device. Error correction logic hardware is decoupled from memory blocks. An error correction logic block is partitioned such that error correction logic entries support different number of error correction capabilities based on the probability of occurrence of the different number of errors in different memory blocks. Faulty memory blocks are mapped to appropriate error correction logic entries. The mapping can be one-to-one or many-to-one depending on embodiments. The adaptive partitioning of the error correction logic entries can be configured to match projected statistical distribution of errors in logic blocks, and can reduce the total error correction logic overhead, provide sufficient error correction, and/or extend the lifetime of the memory device.

25 Claims, 6 Drawing Sheets

| 2 | K | N-1 | N |
|---|---|---|---|
| 0000 | 0110 | 1010 | 1100 |

ADAPTIVE MULTI-BIT ERROR CORRECTION IN ENDURANCE LIMITED MEMORIES

BACKGROUND

The present disclosure generally relates to error correction in memories, and particularly to memory devices having adaptive multi-bit error correction capability and methods of operating the same.

A new class of emerging memory devices has been investigated to overcome the limitations on scaling in conventional dynamic random access memory (DRAM) devices. These memory devices are resistive memory devices of which the status is determined by the resistance level of a variable resistance element. Examples of such resistive memory devices include phase change memory (PCM) devices, memristor devices, magnetic random access memory (MRAM) devices, and spin torque transfer random access memory (STT-RAM) devices. Resistive memory devices can provide increased scalability and higher density than traditional DRAM devices.

However, most resistive memory devices are prone to limited write endurance. Endurance is the maximum number of writes that a memory cell can tolerate before failure. For example, PCM devices typically provide only up to about $10^8$ write operations. During the operation of a typical PCM device, as writes result in repeated expansion and contraction of the chalcogenide alloy due to state change of the cell, there is a higher probability of the material physically detaching from the heating element resulting in the cell being permanently stuck-at a value. For this reason, stuck-at fault errors, which are hard errors in which the state of a memory cell is stuck at a single state irrespective of any write operations performed on the cell, are generally more prevalent than transient faults in the resistive memory devices.

Endurance variation in resistive memory devices tends to have no spatial correlation among neighboring cells. Endurance variation increases with technology scaling, i.e., with the decrease in the dimensions of the memory device. Without error correction mechanisms, the weakest cell dictates the lifetime of a memory device. Error correction mechanisms are necessary to extend the lifetime of a memory device beyond the first cell failure. As wear-out related faults gradually increase with time, single-bit error recovery schemes that are in-place are not sufficient. Therefore, multi-bit error recovery is needed to extend the lifetime of a memory device further.

Hamming coding is one of multi-bit error correction methods known in the art. Original (72,64) Hamming coding was devised for recovering from transient faults. For Single Error Correction Double Error Detection (SECDED), Hamming coding requires 12.5% of the size of each memory block as an overhead for error correction code (ECC) bits to be able to correct only one error.

Error-Correcting Pointer (ECP) was published by Schechter et al., "Use ECP, not ECC, for hard failures in resistive memories", in Proceedings of the 37th annual international symposium on Computer architecture, 2010. The ECP method uses multiple fail pointers for each data block. Each fail pointer has the address of the failed bit in the given data block, and the additional bit storing the correct value. ECP schemes that recover from 6 fails with 61-bit overhead (11.9%) are known in the art.

Stuck-At Fault Error Recovery (SAFER) was published by Nak Hee Seong et al., "SAFER: Stuck-At-Fault Error Recovery for Memories, in Proceedings of the International Symposium on Microarchitecture, 2010, which is incorporated herein by reference. SAFER handles the growing stuck-at faults by dynamic partition and data inversion using readability and permanency of stuck-at faults. SAFER can provide recovery from minimum 6 fails to maximum 32 fails for a 512 bit memory block with a 55-bit overhead, which translates to 10.7% of the size of the memory block.

BRIEF SUMMARY

Multi-bit stuck-at fault error recovery can be enabled by adaptive multi-bit error correction method, in which the overhead of error correction hardware is reduced without affecting the lifetime of the memory device. Error correction logic hardware is decoupled from memory blocks. An error correction logic block is partitioned such that error correction logic entries support different number of error correction capabilities based on the probability of occurrence of the different number of errors in different memory blocks. Each error correction logic entry is configured to correct errors in a memory block. The number of error correction logic entries capable of fixing a memory block having an error count is determined by statistical projection of error distribution in the memory blocks. Thus, a greater number of error correction logic entries are apportioned for correcting memory blocks with a small number of errors, and a smaller number of error correction logic entries are apportioned for correcting memory blocks with a large number of errors. Faulty memory blocks are mapped to appropriate error correction logic entries. The mapping can be one-to-one or many-to-one depending on embodiments. The adaptive partitioning of the error correction logic entries can be configured to match projected statistical distribution of errors in logic blocks, and can reduce the total error correction logic overhead, provide sufficient error correction, and/or extend the lifetime of the memory device.

According to an aspect of the present disclosure, a method of correcting errors in a memory device includes: providing a memory device including at least a plurality of memory blocks and an error correction logic (ECL) entry block including a set of error correction logic (ECL) entries, wherein the set of ECL entries includes a plurality of subsets of ECL entries, and each subset of ECL entries is configured to provide error correction for a different number of bits per memory block in one or more of the plurality of memory blocks, and each of the plurality of memory blocks include first bits for storing data and second bits for storing a pointer to an ECL entry within the ECL block; detecting a writing error in an error-containing memory block among the plurality of memory blocks; locating an available ECL entry in said ECL entry block; and storing an address of the available ECL entry in a pointer of the memory block and storing information for correcting all write errors in the error-containing memory block in the available ECL entry.

According to another aspect of the present disclosure, a memory device includes: a plurality of memory blocks, wherein each of the plurality of memory blocks include first bits for storing data and second bits for storing a pointer to an ECL entry within the ECL block; and an error correction logic (ECL) entry block including a set of error correction logic (ECL) entries, wherein the set of ECL entries includes a plurality of subsets of ECL entries, and each subset of ECL entries is configured to provide error correction for a different number of bits per memory block in one or more of the plurality of memory blocks.

DETAILED DESCRIPTION

Figure 1:
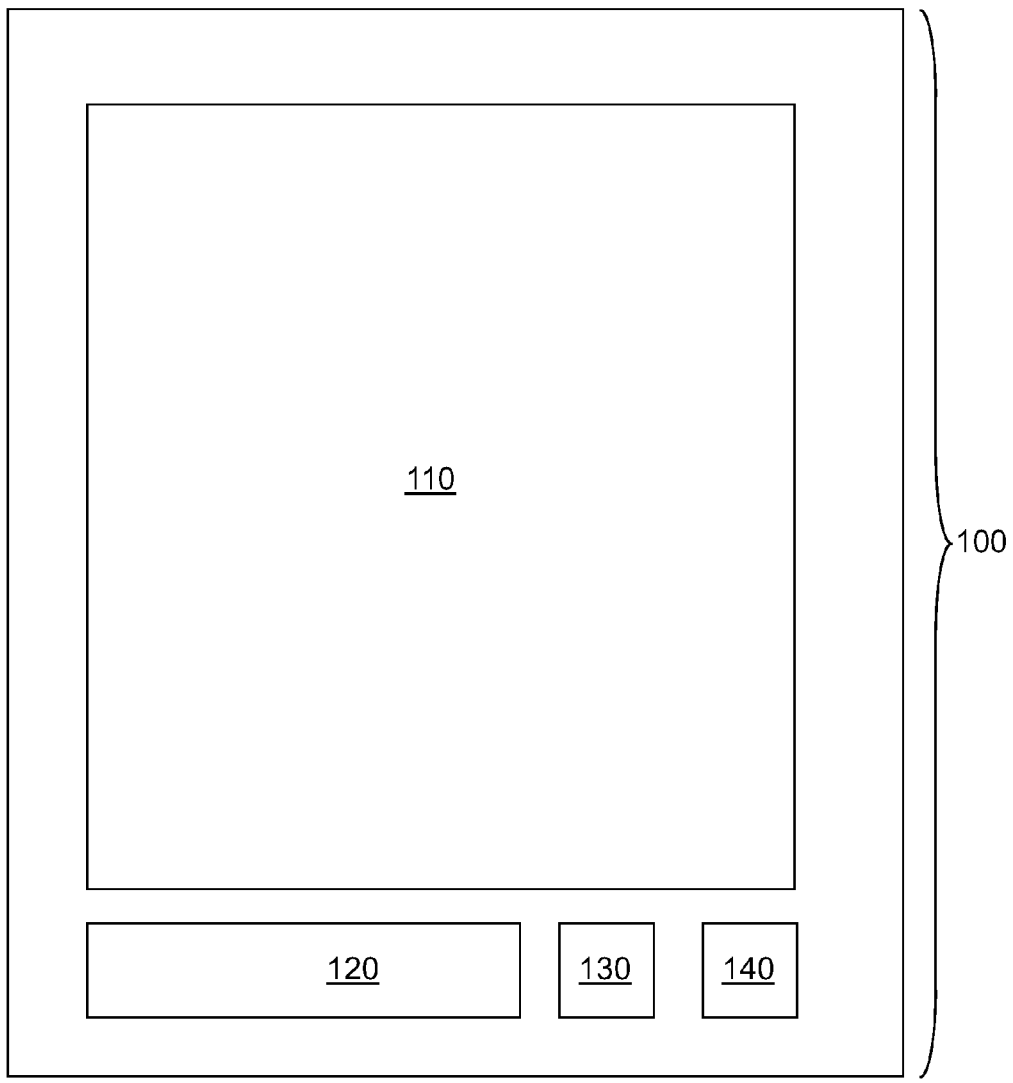
FIG. 1 is schematic view of an exemplary memory device including memory blocks, an error correction logic (ECL) entry block, and an error correction logic (ECL) mapper.

As stated above, the present disclosure relates to memory devices having adaptive multi-bit error correction capability and methods of operating the same, which are now described in detail with accompanying figures Like and corresponding elements mentioned herein and illustrated in the drawings are referred to by like reference numerals. The drawings are not necessarily drawn to scale.

As discussed above, known multi-bit error recovery schemes discussed above incurs significant overhead in order to correct multi-bit errors. In the course of research leading to the present disclosure, Monte Carlo simulations were performed to simulate the distribution of error bit counts in a block in a memory device including multiple memory blocks. A normal distribution of cell lifetime was assumed for the purposes of the simulations with a mean $10^8$ write cycles, and a standard deviation of $10^7$ write cycles. Perfect wear-leveling was assumed during the simulations to enable measurement of lifetime of each memory block having 256 bit of memory. Results were obtained on average across 50,000 iterations. Nearly all the blocks had no error or only a single error at the end of the lifetime. An insignificant number of blocks had more than 17 errors. The simulation results suggested that error correction logic with 5% entries dedicated for 6 or more error correction would be sufficient to maintain the same lifetime.

By decoupling error correction logic (ECL) blocks from individual memory blocks, and by enabling a dynamic mapping between each memory block including write errors and individual error correction logic (ECL) entries in a stand-alone error correction logic (ECL) entry block, an embodiment of the present disclosure takes advantage of the non-uniform frequency of occurrence of write errors across various memory blocks to provide superior error correction and/or less device overhead for error correction in a memory device including multiple memory blocks. Write errors, as mentioned here, and in the rest of the application, are same as permanent stuck-at fault errors. Such stuck-at-fault errors are determined only when a write operation fails to write the desired value in a memory location.

Referring to FIG. 1, an exemplary memory device 100 according to an embodiment of the present disclosure includes a plurality of memory blocks 110, an error correction logic (ECL) entry block 120, an error correction logic (ECL) mapper 130, and an error correction logic (ECL) controller 140 (The ECL controller is part of, or an extension of, the traditional memory controller). The plurality of memory blocks 110 can include a plurality of discrete memory blocks each having a fixed number of data bits. For example, each discrete memory blocks can include $2^P$ number of data bits in which p is a positive integer. Typically, p is an integer between 6 and 20, and more typically an integer between 8 and 14, although lesser and greater numbers can also be employed. The plurality of memory blocks 110 stores data that can be utilized by a central processing unit (CPU; not shown) or any other device component configured to process, transmit, or otherwise use, the data stored in the plurality of memory blocks 110.

The ECL entry block 120 is a distinct hardware that is provided in a separate area from the plurality of memory blocks 110. The ECL entry block 120 is not a sub-component of the plurality of memory blocks 110, and is an error recovery hardware that is provided separately from the plurality of memory blocks 110. The ECL entry block 120 as an error recovery hardware includes a set of error correction logic (ECL) entries. The set of ECL entries include a plurality of subsets of ECL entries. Each plurality of subsets of ECL entries is configured to provide error correction to memory blocks having a different number of write errors per memory block.

The ECL entry block 120 is thus partitioned into a plurality of subblocks, each corresponding to a subset of ECL entries. The total number of error corrections that can be provided by an ECL entry is different from subset to subset. Thus, each subset has a unique total number of errors per memory block that can be corrected by an ECL entry therein. The partitioning of the ECL entry block 120 is based on the probability of occurrence of the different number of multi-bit errors per memory block.

The ECL mapper 130 stores information on partitioning of the ECL entry block 120. Specifically, the ECL mapper 130 stores information on address ranges of each subset of ECL entries in the ECL entry block 120 so as to enable efficient searching of the ECL entry block whenever a new ECL entry needs to be encoded.

The ECL controller 140 controls encoding of the information stored in the ECL entry block 120 and pointer bits present in the plurality of memory blocks 110. The pointer bits in the plurality of memory blocks 110 are additional bits other than data bits, and provide information on which ECL entry within the ECL entry block 120 includes information necessary for error correction for the corresponding individual memory block within the plurality of memory blocks 110.

Figure 2:
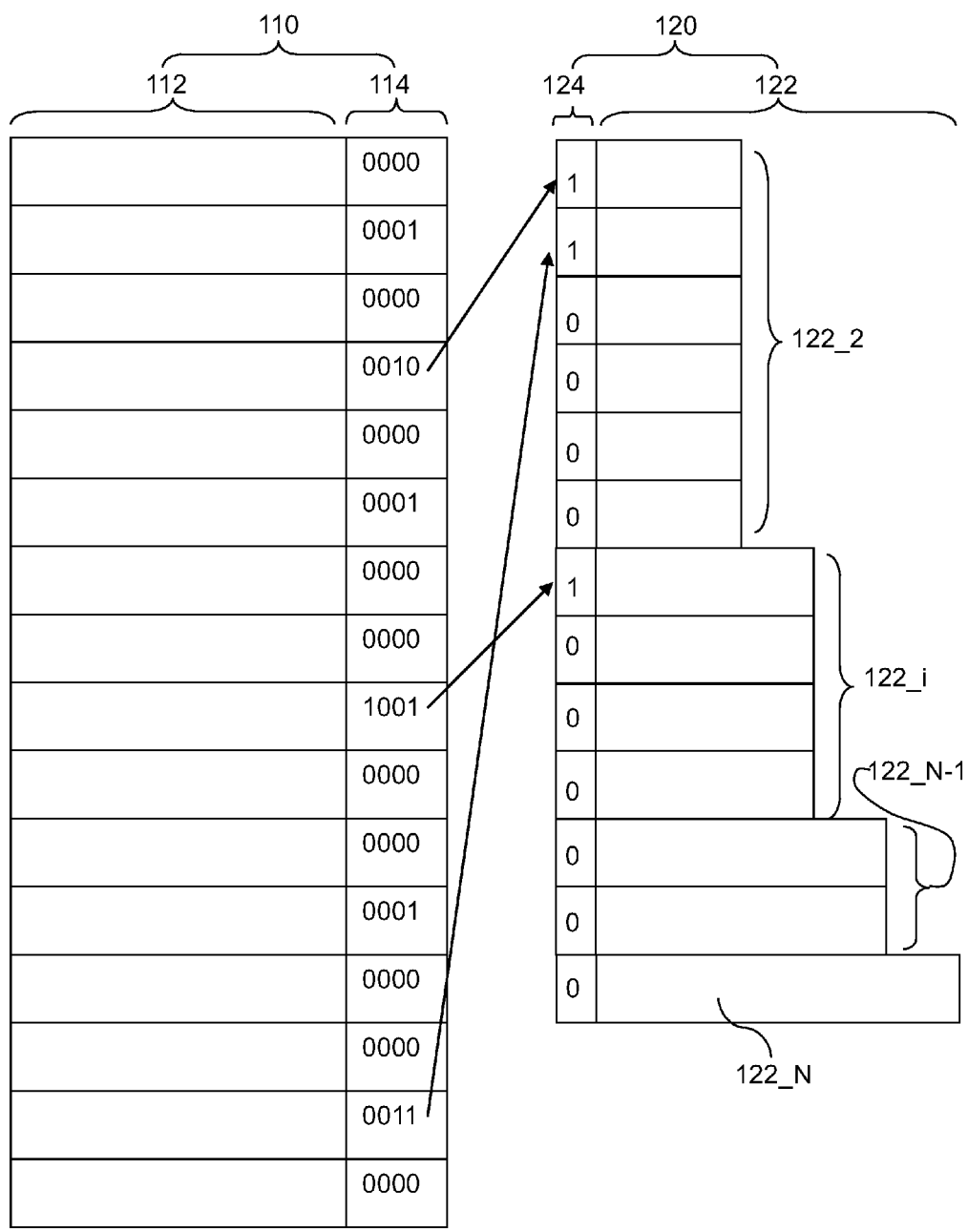
FIG. 2 is a view of the memory blocks and the ECL entry block according to a first embodiment of the present disclosure.

Referring to FIG. 2, components of the plurality of memory blocks 110 and the ECL entry block 120 according to a first embodiment of the present disclosure are illustrated. The plurality of memory blocks 110 includes a plurality of individual memory blocks. Each individual memory block includes a data bit block 112 that includes first bits configured to store data and a pointer bit block 114 that includes second bits configured to store a pointer to an ECL entry within the ECL block 120. Each individual memory block is schematically represented by a rectangle representing a data bit block 112 and a laterally adjoined rectangle representing a pointer bit block 114.

The total number of second bits in each pointer bit block 114 can be selected to enable addressing all addresses in the ECL entry block 120 and to indicate two additional states. The first additional state is a no-error state, i.e., a state in which the corresponding data bit block 112 does not include any error. The second additional state is a one-error state, i.e., a state in which the corresponding data bit block 112 includes a single error. Such a single error can be caused by a Stuck-At-Fault error in which one bit among the corresponding data bit block 112 is stuck at 0 or at 1. In this case, a complement of the data that was originally intended to be stored in the corresponding data bit block 112 is calculated and then stored in the corresponding data bit block 112, and the pointer bit block 114 is set at a value that indicates the second additional state.

For example, if the total number of ECL entries in the ECL entry block 120 is E, then $\log_2(E+2)$ can be calculated and rounded up to the next nearest integer. The addition of 2 to E is necessary to cover the two additional states discussed above. For example, if E is 13, the rounded up integer for $\log_2(E+2)$ is 4. Thus, each pointer bit block 114 can include four bits. Before any error is detected in the plurality of memory blocks 110, the second bits in every pointer bit block 114 are set to a value representing no error, i.e., the first additional state. This value can be, for example, 0000 in the example in which E is 13. If a first error is detected in a data bit block 112 of any individual memory block, the second bits in the corresponding pointer bit block 114 are set to a value representing a single error, i.e., the second additional state. This value can be, for example, 0001 in the example in which E is 13.

For example, if data that was originally intended to be stored in the error-containing data bit block 112 is 001000111100 and the third bit could not be written correctly due to a Stuck-At-Fault error in the third bit (by which the third bit is stuck at 0), i.e., if the stored data in the error-containing data bit block 112 is 000000111100 after at least one attempt to write data, the complement of the data is calculated, which is 110111000011 in this case. The complement of the data can be written without error because the Stuck-At-Fault error in the third bit does not interfere with writing 110111000011 in the error-containing data bit block 112. Here, the term "error-containing" refers to any configuration that does not store true data. The second state of the corresponding pointer bit block 114 is subsequently read along with the data in the error-containing data bit block 112, i.e., 0001 is read along with 000000111100, so that a complement operation is performed upon reading the raw data in the error-containing data bit block 112 to retrieve the correct data.

Thus, if the total write error count in any individual data bit block 112 is either 0 or 1, correct data can be retrieved without resorting to the ECL entry block 120. In the example illustrated in FIG. 2, correct data can be retrieved from data bit blocks 112 of the individual memory blocks that correspond to the first line, the second line, the third line, the fifth line, the sixth line, the seventh line, the eighth line, the tenth line, the eleventh line, the twelfth line, the thirteenth line, the fourteenth line, and the sixteenth line from the top within the plurality of memory blocks 110.

As discussed above, the ECL entry block 120 includes a set of error correction logic (ECL) entries 122. The set of ECL entries 122 includes a plurality of subsets of ECL entries. The plurality of subsets of ECL entries includes a first subset of ECL entries 122_2 and a last subset of at least one ECL entry 122_N. Each ECL entry in the first subset 122_2 is configured to provide error correction for two bits in a memory block, and each ECL entry in the last subset 122_N is configured to provide error correction for N bits in a memory block, wherein N is an integer greater than 2. N is the maximum number of bits that can be error-corrected in any data bit block 112.

In one embodiment, N can be an integer greater than 3, and the plurality of subsets of ECL entries includes the first subset 122_2, the last subset 122_N, and at least one i-th subset of ECL entries 122_i for a set of at least one number i greater than 1 and less than (N−1). In this case, the total number of the subsets of ECL entries can be any number between 2 and N, i.e., at least three and at most N−1. Each ECL entry in the i-th subset is configured to provide error correction for a total number of bits greater than 2 and less than N.

For example, as illustrated in FIG. 2, the plurality of subsets of ECL entries can include a first subset of ECL entries 122_2, at least one i-th subset of ECL entries 122_i for which the number i represents one or more numbers between 2 and N−2, a second to last subset of ECL entries 122_N−1 that is a special case of an i-th subset of ECL entries for which i is N−1, and the last subset of at least one ECL entry 122_N. Each subset of ECL entries (122_2, 122_i, 122_N−1, 122_N) includes one or more error correction logic (ECL) entry. Each error correction entry is represented by a rectangle within one of the subsets of ECL entries (122_2, 122_i, 122_N−1, 122_N). Thus, each subset of ECL entries (122_2, 122_i, 122_N−1, 122_N) is configured to provide error correction for a different number of bits per memory block in one or more of the individual memory block(s) in the plurality of memory blocks 110.

Because the total number of bits required to correct errors in stored data increases with the total number of error bits in most error correction schemes, the total bit size of an ECL entry can be different for each subset of ECL entries (122_2, 122_i, 122_N−1, 122_N) within the set of ECL entries 122. Specifically, the total bit size of an ECL entry configured to correct data stored in a data bit block 112 having a greater number of total error bits is greater than the total bit size of another ECL entry configured to correct data stored in another data bit block 112 having a lesser number of total error bits. In one embodiment, the total bit size in an ECL entry can be a strictly increasing function of the total number of bits that an ECL entry is configured to correct. For example, the total bit size in an ECL entry that is configured to correct a total of three bits is greater than the total size of an ECL entry that is configured to correct a total of two bits, and the total bit size in an ECL entry that is configured to correct a total of i bits is greater than the total size of an ECL entry that is configured to correct a total of i bits for any integer i greater than 2 up to (N−1), in which N is the maximum number for the total number of bits that any ECL entry within the set of ECL entries 122 can correct.

The total number of ECL entries in each subset of ECL entries (122_2, 122_i, 122_N−1, 122_N) can be a monotonically decreasing function of the total number of bits an ECL entry in each subset is configured to correct. For example, in FIG. 2, each ECL entry in the first subset of ECL entries 122_2 is configured to correct a total of 2 bits, each ECL entry in the at least one i-th subset of ECL entries 122_i is configured to correct a total of i bits, each ECL entry in the second to last subset of ECL entries 122_N−1 is configured to correct a total of N−1 bits, and each ECL entry in the last subset of at least one ECL entry 122_N is configured to correct a total of N bits. The total number of ECL entries in any subset among at least one i-th subset of ECL entries 122_i does not exceed the total number of ECL entries in the first subset of ECL entries 122_2. Likewise, for each integer i less than N, the total number of ECL entries the (i+1)-th subset of ECL entries 122_(i+1) does not exceed the total number of ECL entries in the i-th subset of ECL entries 122_i.

A total number of ECL entries $M_i$ can be assigned for each i-th subset of ECL entries 122_i. The total number of subsets of ECL entries is herein referred to as integer L. Thus, each i-th subset of ECL entries 122_i has $M_i$ number of ECL entries for each positive integer i that does not exceed L. The sum of all $M_i$'s equals the total number of ECL entries in the ECL entry block 120, i.e., $$\sum_{i=1}^{L} M_i = E.$$

Further, $M_{i+1} \leq M_i$ for each positive integer i less than L.

During design of the memory device 100, the ECL entry block 120 can be partitioned into a plurality of subblocks each including one of the subsets of ECL entries (122_2, 122_i, 122_N−1, 122_N). The number of total bits in an ECL entry can be the same within each subblock, and can be different from the number of total bits in an ECL entry in any different subblock. The total number of bits can be assigned a number $B_i$ for each ECL entry belonging to the i-th subset of ECL entries 122_i. The number of bits $B_i$ in ECL entries in each subset of ECL entries (122_2, 122_i, 122_N−1, 122_N) can be a strictly increasing function of the total number of bits an ECL entry in each subset is configured to correct. For example, in FIG. 2, each ECL entry in the first subset of ECL entries 122_2 can include $2B_0$ bits, each ECL entry in the at least one i-th subset of ECL entries 122_i can include $iB_0$ bits, each ECL entry in the second to last subset of ECL entries 122_N−1 can include $(N-1)B_0$ bits, and each ECL entry in the last subset of at least one ECL entry 122_N can include $NB_0$ bits, $B_0$ can be the number of bits needed to encode data for correcting a single write error in a data bit block 112. Embodiments in which the total number of bits in an ECL entry is not linearly proportional to the total number of write error bits in a data bit block 112 can also be employed.

The ECL entry block 120 can further include a plurality of at least one occupancy bit 124. Each of the plurality of the at least one occupancy bit 124 can be a single bit that indicates whether the corresponding ECL entry currently stores data for correcting information in first bits in a corresponding memory block. Each occupancy bit 124 can thus have a value of 0 or 1. For example, each occupancy bit 124 can have the value of 0 to indicate the availability of the corresponding ECL entry, or can have the value of 1 to indicate the unavailability of the corresponding ECL entry, i.e., that error correction information for a data bit block 112 has already been stored in the corresponding ECL entry. The error correction information indicates how to correct errors in first bits in a corresponding memory block, i.e., in the data bit block 112 of the corresponding memory block.

The plurality of memory blocks 110 and the ECL entry block 120 can be operated to perform the following operations. First, a writing error in an error-containing memory block among the plurality of memory blocks 110 is detected. The detecting of a writing error can be achieved, for example, by writing target data into an individual memory block, by reading the newly written data, and by comparing the target data with the data as read from the individual memory block.

In some cases, individual memory block may be known to have pre-existing writing error(s), as indicated by any value of the corresponding pointer bit block 114 and, if more than two write errors are present, as provided in a corresponding ECL entry. In this case, the target data is written into the individual memory block in an appropriately altered form and bits in the corresponding ECL entry are altered in order to enable complete error correction under the assumption that the total number of writing errors has not changed. The reading of the data from that individual memory block is followed by any appropriate error correction operation as provided by the corresponding ECL entry.

If the data read from the individual memory block matches the target data, either without error correction if there is no previously known writing error or with error correction under the assumption that only previously known writing errors exist depending on whether any writing error exists in that individual memory block, there is no new writing error. In this case, there is no need to alter the value in the corresponding pointer bit block 114 or the contents of the corresponding occupancy bit 124.

If the data read from the individual memory block matches the target data, either without error correction if there is no previously known writing error or with error correction under the assumption that only previously known writing errors exist depending on whether any writing error exists in that individual memory block, there is at least one new writing error. If that individual memory block previously had no writing error or a single writing error but now contains two or more writing errors, the content of the corresponding pointer block 114 can be changed to a value that indicates an address of an ECL entry. This ECL entry was previously available, i.e., had a corresponding occupancy bit 124 of 0. As the new ECL entry encodes information for error-correcting the data stored in the data bit block 112 of the individual memory block containing the newly found writing errors, the corresponding occupancy bit 124 is set to 1. Information for correcting the writing errors in the data bit block 112 is stored in the ECL entry.

The selection of the ECL entry, in which the error correction information is stored, is performed in a systematic manner to ensure that the ECL entry has data correction capability of sufficient strength, i.e., that the ECL entry has enough bits to encode the error correction information appropriately. Thus, an available ECL entry is located among at least one subset of ECL entries configured to provide error correction for a same number of bits as, or a greater number of bits than, a total number of write errors in the error-containing memory block.

For example, if the total number of write errors in the error-containing memory block is 2, an available ECL entry is located among the subsets of ECL entries (122_2, 122_i, 122_N−1, 122_N) that are configured to provide error correction for 2 bits or more. Preferably, the available ECL entry is selected from within a subset of ECL entries configured to provide the least bits of error correction among the at least one subset of ECL entries (122_2, 122_i, 122_N−1, 122_N), which is the first subset of ECL entries 122_2 having the error correction capabilities for 2 bits per data bit block 112. If no ECL entry is available in the first subset of ECL entries 122_2, then an available ECL entry is searched, for example, in the second subset of ECL entries having the next minimum number of error correction bits such as 3. In general, if the total number of write errors in the error-containing memory block is k, an available ECL entry is located among the subsets of ECL entries that are configured to provide error correction for k bits or more. Preferably, the available ECL entry is selected from within a subset of ECL entries configured to provide the least bits of error correction among the at least one subset of ECL entries that are configured to provide error correction for k bits or more.

In one embodiment, the identification of an available ECL entry and subsequent changes to the contents of the corresponding pointer bit block 114 and the corresponding occupancy bit 124 can be effected by the ECL controller 140 (See FIG. 1). Thus, the ECL controller 140 can detect a writing error in an error-containing memory block among the plurality of memory blocks 110, and locate an available ECL entry among at least one subset of ECL entries (122_2, 122_i, 122_N−1, 122_N) configured to provide error correction for a same number of bits as, or a greater number of bits than, a total number of write errors in the error-containing memory block. In this case, the ECL controller 140 can be configured to store an address of the available ECL entry in a pointer, which is the content of the corresponding pointer bit block 114, of the error-containing memory block, and to store information for correcting all write errors in the error-containing memory block in the available ECL entry.

In another embodiment, the ECL controller 140 may not be provided within the memory device 100, but may be provided as an integral part of a Dual In-line Memory Module (DIMM) or even the Central Processing Unit (CPU). In yet another embodiment, the function of the ECL controller may be achieved by a program residing on another memory device, such as a hard disk or a cache memory, which utilizes the processing resources of a central processing unit during the course of running the program.

If identification, i.e., location, of an available ECL entry is not possible because there is no available entry in the subsets of the ECL entries capable of providing error correction for the number of error bits in the newly identified error-containing memory block, a signal indicating impossibility of error correction can be sent to an appropriate controller such as a central processing unit. For example, if at least one additional writing error is found during a write operation into a data bit block 112 and the total number of writing errors in the data bit block 112 is k, and if the subsets of ECL entries within the ECL entry block 120 for correcting k or more errors do not have any available ECL entry, a signal indicating impossibility of error correction can be generated and sent to an appropriate device.

As an illustrative example, the fourth data bit block 112 from the top of the plurality of memory blocks 110 in FIG. 2 can include two writing errors, the ninth data bit block 112 from the top of the plurality of memory blocks 110 in FIG. 2 can include three writing errors, and the fifteenth data bit block 112 from the top of the plurality of memory blocks 110 in FIG. 2 can include two writing errors. The corresponding pointer bit blocks 114 can be set to 0010, 1001, and 0011, respectively. In this example, the bits in these pointer bit blocks 114 represent the numerical sum of 2 and the number representing the address of a corresponding ECL entry in which the error correction information for the corresponding data bit block 112. In other words, the number represented by one of the pointer bit blocks 114 less 2 equals the address of the corresponding ECL entry in the ECL entry block 120. The top ECL entry among the first subset of ECL entries 122_2 includes information for error-correcting the two error bits in the fourth data bit block 112, the second from the top entry among the first subset of the ECL entries 122_2 includes information for error-correcting the two error bits in the fifteenth data bit block 112, and the first entry in the at least one i-th subset of ECL entries 122_i includes information for error-correcting the three error bits in the ninth data bit block 112. A one-to-one mapping is provided between the pointer bit blocks 114 indicating the presence of more than one writing errors, and the ECL entries flagged as occupied by the corresponding occupancy bits 124 that are set to 1.

In general, each error-containing memory block including multiple error bits is mapped to the appropriate error correction hardware capable of correcting all the errors present in that memory block, i.e., to an appropriate ECL entry in the ECL entry block 120. Thus, the hardware for the error correction logic, i.e., the ECL entry block 120, is decoupled from the plurality of memory blocks 110 by a dynamic adaptive mapping, which changes with detection of additional writing errors in the plurality of memory blocks 110 during the usage of the memory device 100 (See FIG. 1). As used herein, a "dynamic adaptive mapping" refers to allocation of ECL entries as needed upon detection of any additional error in a plurality of memory blocks that do not have a one-to-one mapping to any specific ECL entry.

The maximum number of faulty memory blocks is set at the number E, which is the total number of ECL entries in the ECL entry block 120. E can be less than the total number of blocks in the plurality of memory blocks 120. Since the total number of ECL entries in the ECL entry block 120 can be less than the total number of blocks in the plurality of memory blocks 120, the overhead of error correction logic as measured by the amount of hardware can be reduced compared to prior art error correction methods.

Figure 3:
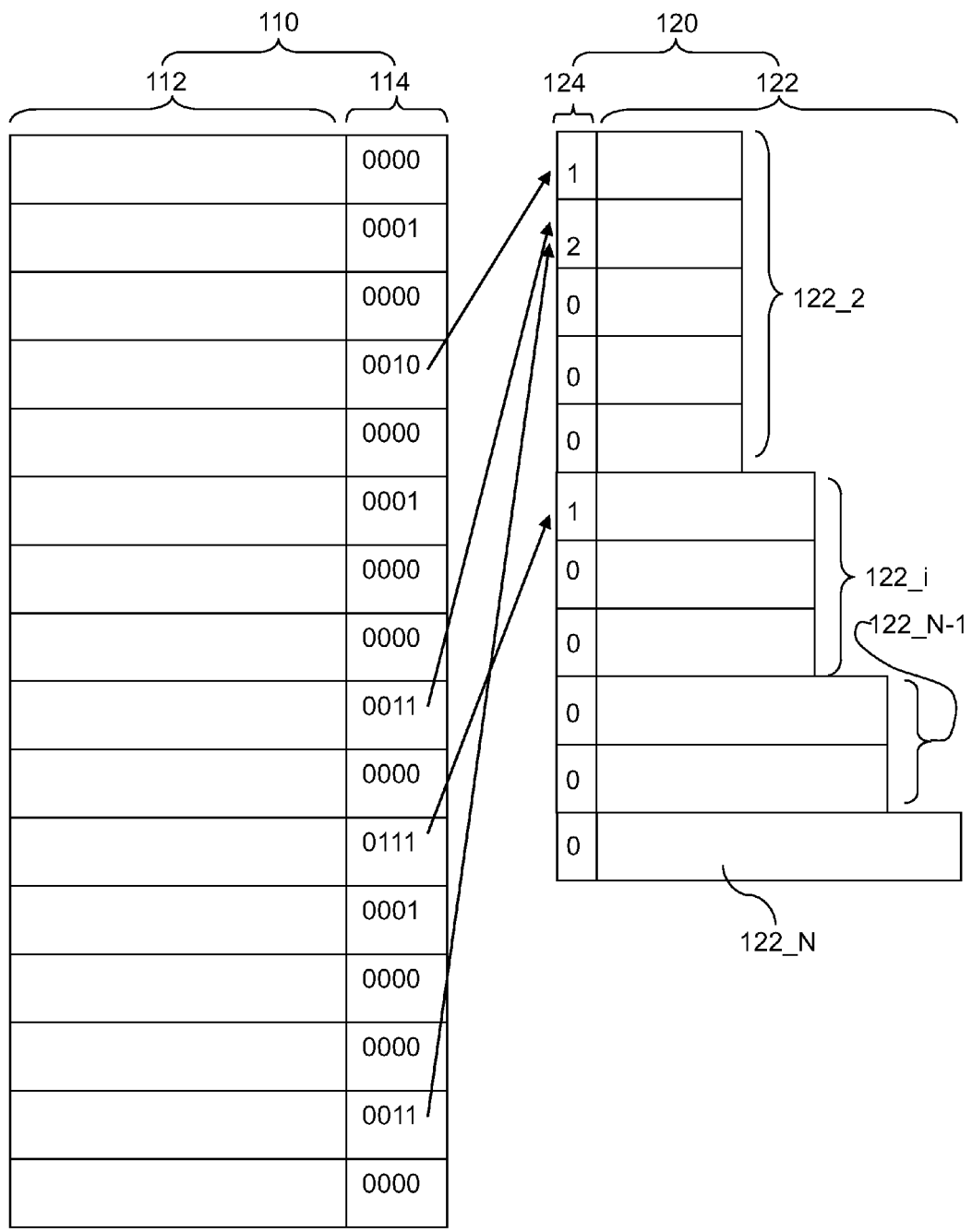
FIG. 3 is a view of the memory blocks and the ECL entry block according to a second embodiment of the present disclosure.

Referring to FIG. 3, components of the plurality of memory blocks 110 and the ECL entry block 120 according to a second embodiment of the present disclosure are illustrated. In the second embodiment, many-to-one mapping is enabled between the pointer bit blocks 114 indicating the presence of more than one writing errors and the ECL entries including information for correcting errors in error-containing data bit blocks 112 provided that the same bits in an ECL entry can be used to correct writing errors in two or more error-containing data bit blocks 112.

Thus, if the same error correction code can be employed to correct two or more writing errors in multiple error-containing data bit blocks 112, the pointer bit blocks 114 for the multiple error-containing data bit blocks 112 point to the same ECL entry that includes the error correction code that is common for these multiple error-containing data bit blocks 112. In other words, many-to-1 mapping of memory blocks to error correction logic is enabled if different memory blocks have faulty bits in the same set of bit locations.

The second embodiment enables reduction of error correction logic overhead by allowing multiple memory blocks to share the same error correction logic stored in the same ECL entry. In order to implement sharing of the same ECL entry for multiple memory blocks having writing errors in the same set of faulty bit positions, an additional check can be performed before allocating an error correction logic to determine whether there is an already allocated ECL entry which corrects the errors in the same bit positions as with the newly detected error-containing memory block that includes at least one new writing error.

The ECL entry block 120 can include a plurality of at least one occupancy bit 124. In one embodiment, the at least one occupancy bit 124 corresponding to each ECL entry can be a plurality of bits. Each plurality of bits can indicate how many of the memory blocks include writing errors that can be corrected by employing information stored in the each ECL entry. For example, if m error-containing data bit blocks 112 are mapped to an ECL entry, the corresponding plurality of occupancy bits 124 can encode the number m.

As an illustrative example, the ninth data bit block 112 from the top of the plurality of memory blocks 110 in FIG. 3 can include two writing errors in a set of faulty bit positions, and the fifteenth data bit block 112 from the top of the plurality of memory blocks 110 in FIG. 3 can include two writing errors in the same set of faulty bit positions. The corresponding pointer bit blocks 114 are set to indicate the same address. Specifically, the pointer bit blocks 114 for the ninth data bit block 112 and the pointer bit blocks 114 for the fifteenth data bit block 112 are set to have a value of 0011, which points to the address of 0001 (after subtracting 2) in the ECL entry block 120. A plurality of occupancy bits 124 for the second ECL entry in the ECL entry block is set to indicate the number 2, for example, by being set to 10, 010, 0010, 00010, 00010, etc., depending on the total number of bits in the plurality of occupancy bits 124.

In general, each plurality of occupancy bits 124 can indicate the availability of the corresponding ECL entry (for example, by having a value of 0) and also indicate how many of error-containing data bit blocks 112 are mapped to the corresponding ECL entry.

Figures 4, 5:
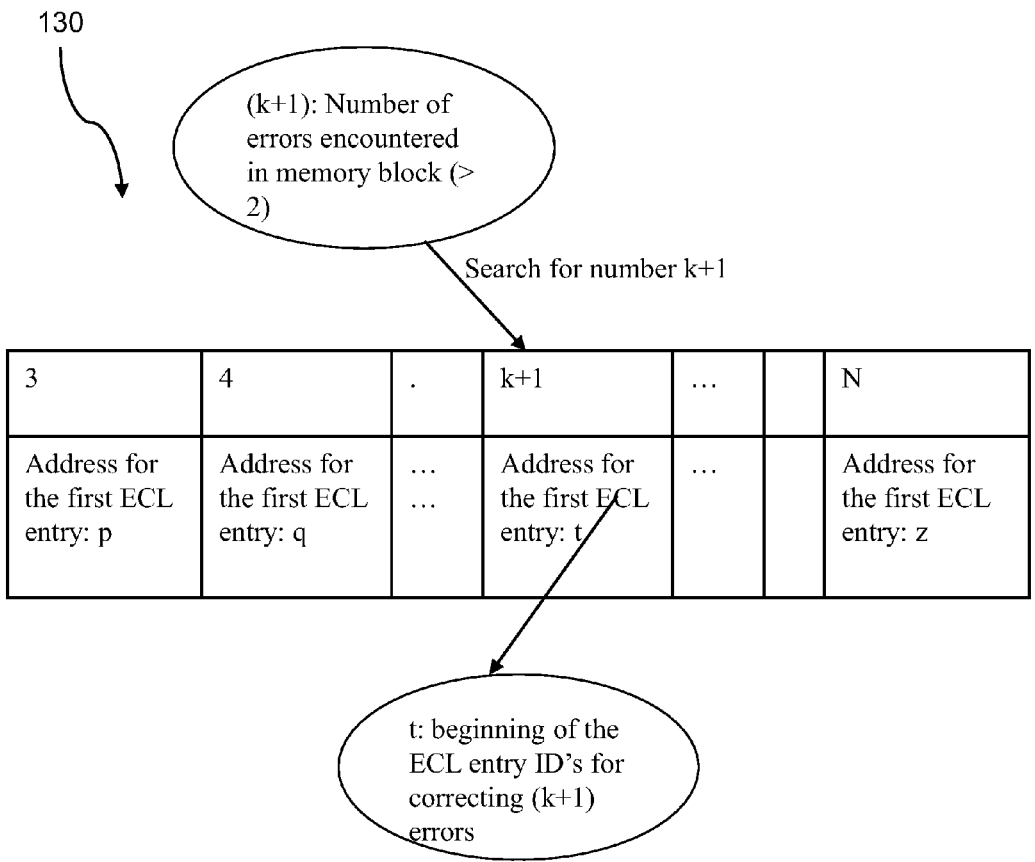
FIG. 4 is a view of the ECL mapper according to embodiments of the present disclosure.
FIG. 5 is a view of an exemplary ECL mapper for the ECL memory block illustrated in FIG. 2.

Referring to FIG. 4, the ECL mapper 130 is illustrated. The ECL mapper 130 includes information on location of each subset of ECL entries within the ECL entry block 120. The ECL mapper 130 includes a set of representative addresses that allows identification of the address ranges of each subset of ECL entries (122_2, 122_i, 122_N−1, 122_N). In one example, the ECL mapper 130 can include a set of first addresses in all subsets of ECL entries or first addresses of all other subsets of ECL entries than the first subset of ECL entries (which is 0). In another example, the ECL mapper 130 can include a set of last addresses in all subsets of ECL entries or last addresses of all other subsets of ECL entries than the last subset of ECL entries (which is the address of the last ECL entry of the ECL entry block 120).

The ECL mapper 130 may be provided in a table format containing two rows or two columns. The first row or the first column can include the maximum number of bits per error-containing data bit block 112 that each subset of ECL entries are configured to correct. The second row or the second column can include the first address or the last address of the corresponding subset of ECL entries. If the first addresses of the subsets of ECL entries are listed in the ECL mapper 130, the entry for the first subset of ECL entries configured to correct two writing errors may be omitted, as in the case of FIG. 4, because the first address of the first subset of ECL entries in that case is 0.

As an illustrative example as applied to the ECL entry block 120 in FIG. 2, if the ECL mapper 130 includes a set of first addresses in all subsets of ECL entries, and the set of ECL entries includes a first subset of six ECL entries 122_2 configured to fix two writing errors, an i-th subset of four ECL entries 122_i configured to fix K writing errors, a second to last subset of two ECL entries 122_N−1 configured to fix N−1 writing errors, and a last subset of one ECL entry 122_N configured to fix N writing errors, the ECL mapper 130 may include a table illustrated in FIG. 5. As discussed above, the first column in the table of FIG. 5 may be omitted because the software can be programmed to recognize the address 0000 as the first address of the first subset of ECL entries 122_2.

The ECL entries in the ECL entry block 120 can encode error correction data employing any error correction schemes known in the art. Error correction schemes that can be employed in the ECL entry block 120 include, but are not limited to, error correction pointer (ECP) method as disclosed in Schechter et al. or Stuck-At-Fault Error Recovery (SAFER) method as disclosed in Nak Hee Seong et al.

Figure 6:
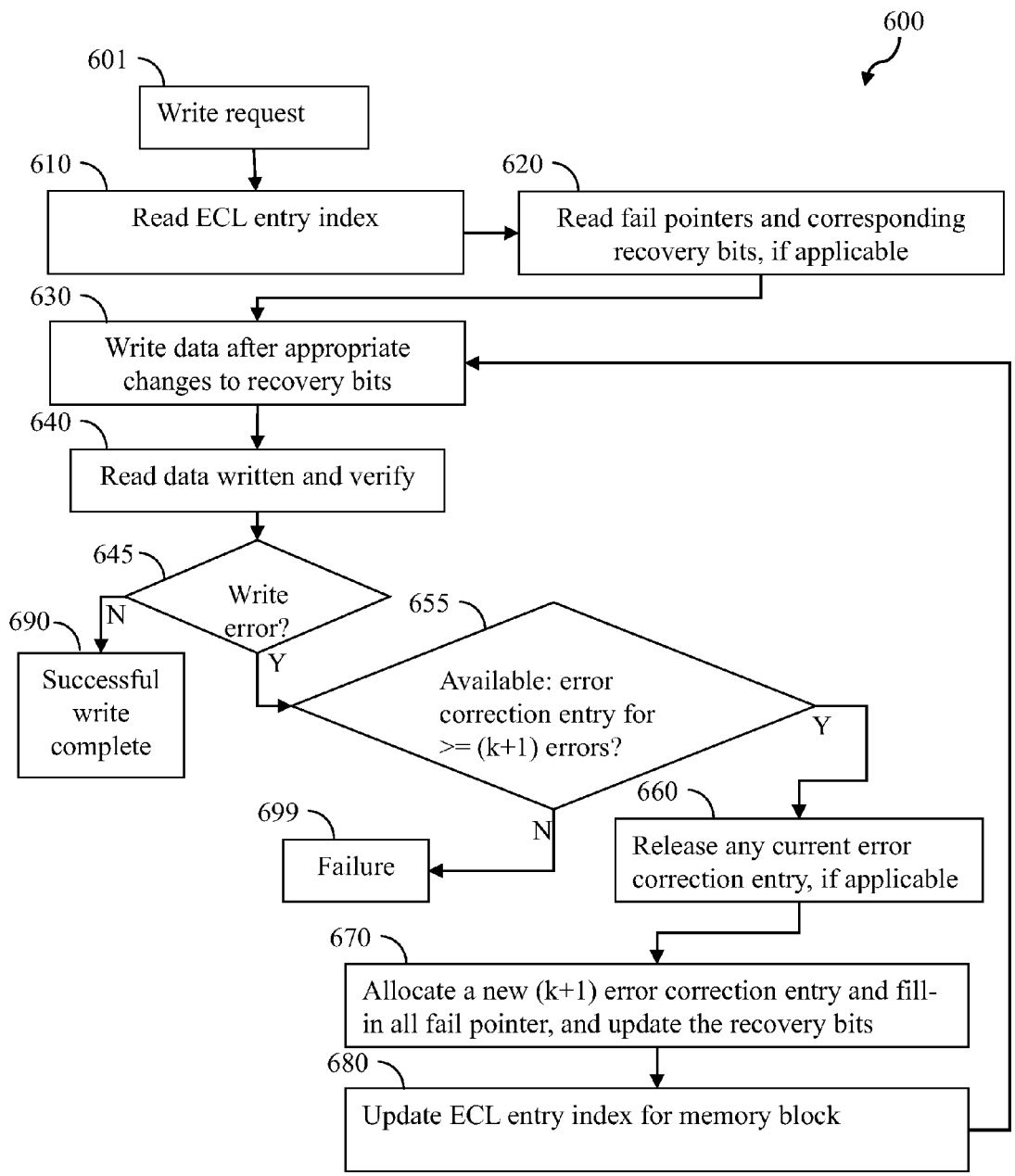
FIG. 6 is a first flow chart illustrating a first adaptive multi-bit error correction method according to an embodiment of the present disclosure.

Referring to FIG. 6, a first flow chart 600 illustrates a first adaptive multi-bit error correction method that employs the ECP method for encoding error correction data. In the first stage of the first flow chart, a writing error is detected in an individual memory block within the plurality of memory blocks 110. See FIGS. 1, 2, and 3.

Referring to step 601, a write request is made, which is an instruction to write target data into a specified memory block within the plurality of memory blocks 110. The specified memory block includes first bits that are configured to store data and second bits that are configured to store a pointer, which is an error correction logic entry index (ECL index). The first bits constitute the data bit block 112, and the second bits constitute the pointer bit block 114.

Referring to step 610, the ECL entry index is read for the specified memory block. The ECL entry index is the data of the pointer stored within the pointer bit block 114 that corresponds to the specified memory block.

If the ECL entry index is in a first state (such as 0000 in FIGS. 2 and 3) that indicates that there is no writing error in the specified memory block, the step 620 does not introduce any additional operation. If the ECL entry index is in a second state (such as 0001 in FIGS. 2 and 3) that indicates that there is a single writing error in the specified memory block, the step 620 enables an operation that compensates for the single bit writing error. For example, the operation that compensates for the single bit writing error may be the complement operation that flips every bit of the target data before attempting to store the target data in the specified memory block.

If the ECL entry index is not in the first state or in the second state, two or more writing errors were previously detected within the specified memory block and an ECL entry within the ECL entry block 120 is associated with the specified memory block. At step 620, the address of the ECL entry mapped to, i.e., associated with, the specified memory block can be derived from the contents of the corresponding pointer bit block 114, i.e., from the ECL entry index by a predetermined algorithm, such as by subtracting a value of 2 as illustrated in FIGS. 2 and 3. The contents of the ECL entry mapped to the specified memory block includes fail pointers that identify the bit positions of the failed bits within the data bit block 112 of the specified memory block, as well as corresponding recovery bits for each of the fail pointers.

For example, each pointer bit block can have int[$\log_2(E)$] bits to indicate the number of errors or a mapped-to ECL entry index. E is the total number of ECL entries in the ECL entry block 120, and int is a function that rounds up the operant to the next nearest integer. If the ECL entry index is 0, the corresponding data bit block 112 has 0 error. If the ECL entry index is 1, the corresponding data bit block 112 has 1 error. If the ECL entry index has a value between, and including, 2 and E−1, there exists a mapped-to ECL entry, i.e., an ECL entry associated with the specified memory block, of which the address is the value of the ECL entry index less 2.

Referring to step 630, target data is written into the data bit block 112 of the specified memory block either in the original form or in an altered form. Specifically, the target data is written into the data bit block 112 of the specified memory block in the original form if the ECL entry index is in the first state that indicates that there is no writing error in the specified memory block. If the ECL entry index is in the second state that indicates that there is a single writing error in the specified memory block, the target data is written into the data bit block 112 of the specified memory block in an altered form that is derived from the target data, which can be, for example, the complement of the original target data. If the ECL entry index is not in the first state or in the second state and an ECL entry within the ECL entry block 120 is associated with the specified memory block, the target data is converted into an alternate format which, after error correction using the contents of the mapped-to ECL entry within the ECL entry block 120, reproduces the original target data. The contents of the mapped-to ECL entry, and specifically, the data in the recovery bits of the mapped-to ECL entry, are changed during this data writing step.

Referring to step 640, the data written into the data bit block 112 of the specified memory block is read (with error correction described herein using the contents of any mapped-to ECL entry as applicable) and verified against the original target data.

Referring to step 645, the ECL controller 140 or any applicable program running on a central processing unit (CPU) determines whether there is a writing error in storing the target data in the specified memory block. If the data that is read from the data bit block 112, the corresponding pointer bit block 114, and any mapped-to ECL entry, if present, matches the original target data, there is no writing error. The process flow continues to step 690, and a signal for a successful write complete can be generated by the ECL controller or by the program.

If the data that is read from the data bit block 112, the corresponding pointer bit block 114, and any mapped-to ECL entry, if present, does not match the original target data, there is at least one writing error. If the writing error can be corrected without resorting to the ECL entry block 120, for example, because there is only one writing error in total in the data bit block 112 of the specified memory block, the ECL entry index in the corresponding pointer bit block is changed and another attempt is made to correctly write the target data in the specified memory block. If this attempt is successful, the process flow continues to step 690, and a signal for a successful write complete can be generated by the ECL controller or by the program.

If the writing error can be corrected without resorting to the ECL entry block 120, for example, because there are multiple writing errors in total in the data bit block 112, the process flow continues to step 655. The total number of writing errors in the data bit block 112 is herein referred to as (k+1). The previously known number of errors in the data bit block 112 is a number less than (k+1), and is a number between, and including, 0 and k. By the end of step 645, detection of at least one new writing error is completed.

In the second stage of the first flow chart 600, an available ECL entry for correcting the writing error in the specified memory block is located within the ECL entry block 120. The available ECL entry is located among at least one subset of ECL entries configured to provide error correction for a same number of bits as, or a greater number of bits than, a total number of write errors (k+1) in the error-containing memory block, i.e., the specified memory block.

Whether an ECL entry to correct at least (k+1) writing errors is available can be determined in the following manner. As discussed above, each ECL entry can have a corresponding at least one occupancy bit 124. In the first embodiment, the at least one occupancy bit 124 is a single bit to indicate if it is being used by any memory block, in a 1-to-1 mapping of multiple-error-containing memory blocks to ECL entries. In the second embodiment, the at least one occupancy bit 124 is a plurality of occupancy bits that functions as a counter to indicate the number of memory blocks mapping to a given ECL entry. The counter is incremented whenever a new memory block is mapped to an ECL entry, and decremented whenever a memory block ceases to be mapped to that ECL entry. When the counter value becomes zero, it indicates that the ECL entry is freed.

The total number of ECL entries in each subset of ECL entries is pre-determined, and is pre-loaded in registers. To effect this operation, the ECL mapper 130 described above can be employed. If the total number of subsets of ECL entries is L, a hardware table of L rows or L columns can be employed for the ECL mapper 130 as illustrated in FIG. 5. Alternately, a hardware table of L−1 rows or L−1 columns can be employed for the ECL mapper 130 as illustrated in FIG. 4, if the first addresses of the corresponding ECL entries are listed in the table. Each entry can have int[$\log_2(E)$] bits to indicate the beginning index of the corresponding subset of ECL entries, i.e., the corresponding ECL entry group, capable of correcting the specified maximum number of errors per memory block, i.e., per data bit block 112.

As discussed above, the first ECL entry has the address of 0, i.e., located at the beginning of the first subset of ECL entries capable of correcting 2 writing errors. In the first embodiment, if (k+1) is equal to 2, i.e., if the specified memory block has only 2 errors, the search for an available ECL entry begins from the first ECL entry of the ECL entry block 120. The address of the ECL entry is incremented by 1 if the last searched ECL entry is occupied, as indicated, for example, by the presence of "1" in the corresponding occupancy bit 124. If no available ECL entry is found among the first subset of ECL entries capable of correcting 2 writing errors, the next subset of ECL entries capable of correcting the least number of writing errors among the remaining subsets of ECL entries is searched, and so on until an available ECL entry is found.

In the second embodiment, if (k+1) is equal to 2, the first subset of ECL entries having two error correction bits per memory block is searched if any ECL entry therein encodes the information necessary to error correct the two writing errors present in the specified memory block. If an ECL entry encoding the information necessary to error correct the two writing errors is found during this search, the pointer bit block 114 of the specified memory block is encoded with bits referencing that ECL entry, for example, by storing the number that is the sum of the address of that ECL entry plus the value of 2. The plurality of occupancy bits 124 of that ECL entry is incremented by 1 to indicate that another memory block is mapped to that ECL entry. If such a matching ECL entry is not found, then the search for an available ECL entry begins from the first ECL entry of the ECL entry block 120 in the same manner as in the first embodiment. The address of the ECL entry is incremented by 1 if the last searched ECL entry is occupied, as indicated, for example, by the presence of any number other than 0 in the corresponding plurality of occupancy bits 124. If no available ECL entry is found among the first subset of ECL entries capable of correcting 2 writing errors, the next subset of ECL entries capable of correcting the least number of writing errors among the remaining subsets of ECL entries is searched, and so on until an available ECL entry is found.

In the first and second embodiments, if (k+1) is greater than 2, i.e., if the specified memory block has more than 2 errors, the ECL mapper 130 can be utilized. Referring back to FIG. 4, a minimum number of error correction bits that the subsets of ECL entries provide that is equal to (k+1) or greater than (k+1) is searched in the ECL mapper 130. If the various subsets of ECL entries includes a subset that provides (k+1) error correction per memory block, the address for the first ECL entry for that subset, which is shown as t in FIG. 4, is read from the ECL mapper 130. If the various subsets of ECL entries does not include a subset that provides (k+1) error correction per memory block but the minimum number of error correction bits that the subsets of ECL entries provide is (k+j) in which j is greater than 1, the address for the first ECL entry for the subset of ECL entries configured to provide error correction for (k+j) bits is read from the ECL mapper 130.

Referring back to step 655 of FIG. 6, in the first embodiment, if (k+1) is greater than 2, the search for an available ECL entry then begins from the first ECL entry of the subset configured to correct (k+1) writing errors or (k+j) writing errors per memory block. The address of the ECL entry is incremented by 1 if the last searched ECL entry is occupied, as indicated, for example, by the presence of "1" in the corresponding occupancy bit 124. If no available ECL entry is found among the subset configured to correct (k+1) writing errors or (k+j) writing errors, the next subset of ECL entries capable of correcting the least number of writing errors among the remaining subsets of ECL entries is searched, and so on until an available ECL entry is found.

In the second embodiment, if (k+1) is greater than 2, the subset configured to correct (k+1) writing errors or (k+j) writing errors per memory block is searched if any ECL entry therein encodes the information necessary to error correct the (k+1) writing errors present in the specified memory block. If an ECL entry encoding the information necessary to error correct the (k+1) writing errors is found during this search, the pointer bit block 114 of the specified memory block is encoded with bits referencing that ECL entry, for example, by storing the number that is the sum of the address of that ECL entry plus the value of 2. The plurality of occupancy bits 124 of that ECL entry is incremented by 1 to indicate that another memory block is mapped to that ECL entry. If such a matching ECL entry is not found, then the search for an available ECL entry begins from the subset configured to correct (k+1) writing errors or (k+j) writing errors in the same manner as in the first embodiment. The address of the ECL entry is incremented by 1 if the last searched ECL entry is occupied, as indicated, for example, by the presence of any number other than 0 in the corresponding plurality of occupancy bits 124. If no available ECL entry is found among the subset configured to correct (k+1) writing errors or (k+j) writing errors, the next subset of ECL entries capable of correcting the least number of writing errors among the remaining subsets of ECL entries is searched, and so on until an available ECL entry is found.

In the first embodiment, the available ECL entry is an ECL entry that is empty (does not store any error correction information) and has enough error correction bits, i.e., at least (k+1) error correction bits. In the second embodiment, the available ECL entry is either an ECL entry that already encodes the same error correction data bits that are need to correct the newly found error-containing memory block or an ECL entry that is empty and has enough error correction bits. In order to reduce the number of error correction bits stored in the ECL entry block 120, an available ECL entry with the least number of error correction bits is selected if more than one ECL entries can be employed to provide error correction for the newly found error-containing memory block.

If no available ECL entry can be found after searching the entirety of entries in the ECL entry block 120, the process flow proceeds to step 699. A signal indicating impossibility of error correction is generated and sent to an appropriate device such as a central processing unit (CPU).

If an available ECL entry is found, the process flow proceeds to step 660. If the selected memory block is currently associated with an occupied ECL entry, i.e., an occupied ECL entry that was previously mapped based on a prior detection of writing errors, the currently associated ECL entry is released partially or fully. In the first embodiment, the currently associated ECL entry is released fully by changing the corresponding single occupancy bit from "1" to "0." In the second embodiment, the currently associated ECL entry is released either fully by changing the corresponding plurality of occupancy bits from the value of 1 to the value of 0, or partially by decrementing by 1 the corresponding plurality of occupancy bits from an integer greater than 1.

Once an appropriate available ECL entry is located, the available ECL entry is allocated by the ECL controller 140 or the program controlling the memory storage in the memory device 100. The new ECL entry is allocated to the specified memory block. The new ECL entry is updated according to an error recovery scheme. The ECL entry pointer held previously by the memory block is updated. In other words, the address of the new ECL entry is stored in the pointer, i.e., the ECL entry index, of the specified error-containing memory block, and information for correcting all write errors in the specified error-containing memory block is stored in the new ECL entry.

Referring to step 670, the new ECL entry among the subset of ECL entries configured to correct at least (k+1) writing errors is allocated to correct the writing error in the specified memory block that has been found to contain at least one new writing error. As discussed above, the subset of ECL entries configured to correct at least (k+1) writing errors can be the subset of ECL entries configured to correct (k+1) writing errors or the subset of ECL entries configured to correct (k+j) writing errors depending on the presence of a new or preexisting "available ECL entry" capable of correcting the (k+1) writing errors in the specified memory block.

Specifically, the contents of the new ECL entry is changed appropriately to encode information necessary to error-correct the raw data stored in the data bit block 112 of the specified memory block. For example, the contents of the new ECL entry can include fail pointers and recovery bits for the data bit block 112. The information includes at least one bit pointer that points to at least one individual error bit within the first bits, i.e., in the data bit block 112. Typically, the information includes multiple bit pointers that points to multiple individual error bits within the data bit block 112.

Referring to step 680, the ECL entry index for the pointer bit block 114 of the specified memory block is changed to reference the new ECL entry, for example, by storing a value that is equal to the sum of 2 and the address of the new ECL entry.

The process flow can then proceed to step 630 to confirm that the target data can be correctly written in the selected memory block employing the new error correction scheme as embodied in the pointer bit block 114 and the new ECL entry.

Figure 7:
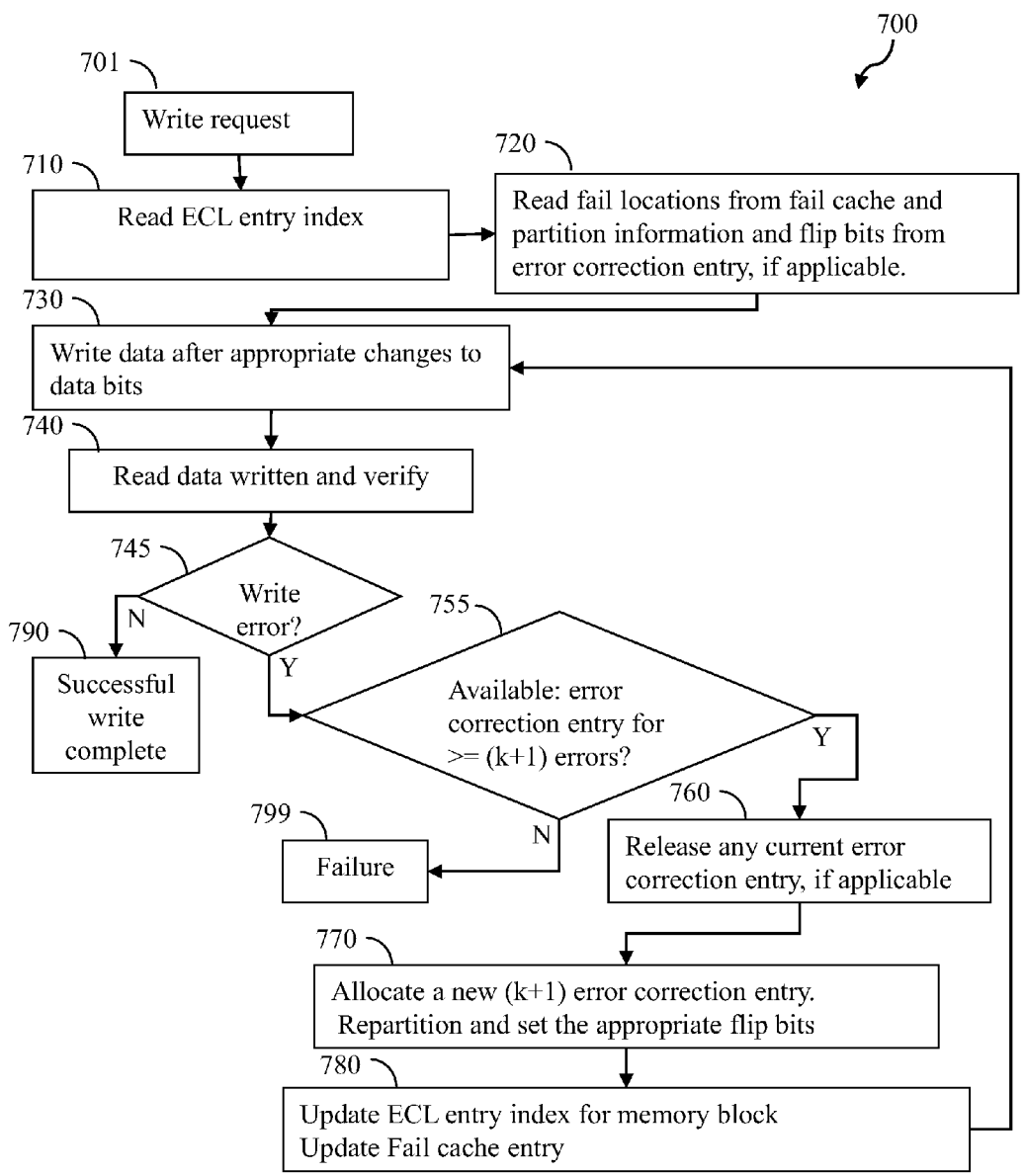
FIG. 7 is a second flow chart illustrating a second adaptive multi-bit error correction method according to another embodiment of the present disclosure.

Referring to FIG. 7, a second flow chart 700 illustrates a second adaptive multi-bit error correction method that employs the Stuck-At-Fault Error Recovery (SAFER) method for encoding error correction data. In the first stage of the second flow chart 700, a writing error is detected in an individual memory block within the plurality of memory blocks 110 in the same manner as in the first flow chart 600 in FIG. 6.

Referring to step 701, a write request is made in the same manner as in step 601 of the first flow chart.

Referring to step 710, the ECL entry index is read for the specified memory block in the same manner as in step 610 of the first flow chart in FIG. 6.

If the ECL entry index is in a first state (such as 0000 in FIGS. 2 and 3) that indicates that there is no writing error in the specified memory block, the step 720 does not introduce any additional operation. If the ECL entry index is in a second state (such as 0001 in FIGS. 2 and 3) that indicates that there is a single writing error in the specified memory block, the step 720 enables an operation that compensates for the single bit writing error. For example, the operation that compensates for the single bit writing error may be the complement operation that flips every bit of the target data before attempting to store the target data in the specified memory block.

If the ECL entry index is not in the first state or in the second state, two or more writing errors were previously detected within the specified memory block and an ECL entry within the ECL entry block 120 is associated with the specified memory block. At step 720, the address of the ECL entry mapped to, i.e., associated with, the specified memory block can be derived from the contents of the corresponding pointer bit block 114, i.e., from the ECL entry index by a predetermined algorithm, such as subtraction of a value of 2 as illustrated in FIGS. 2 and 3. The contents of the ECL entry mapped to the specified memory block are different from the contents in the first flow chart 600 due to the different error correction algorithm employed in the second flow chart 700. Specifically, the ECL entry mapped to the specified memory block includes fail cache and flip bits. The information on fail cache and the flip bits is analyzed to determine the fail location and the partition information at step 720.

As in the methods of the first flow chart 600, each pointer bit block can have int[$\log_2(E)$] bits to indicate the number of errors or a mapped-to ECL entry index. If the ECL entry index is 0, the corresponding data bit block 112 has 0 error. If the ECL entry index is 1, the corresponding data bit block 112 has 1 error. If the ECL entry index has a value between, and including, 2 and E−1, there exists a mapped-to ECL entry, i.e., an ECL entry associated with the specified memory block, of which the address is the value of the ECL entry index less 2.

Referring to step 730, target data is written into the data bit block 112 of the specified memory block either in the original form or in an altered form. Specifically, the target data is written into the data bit block 112 of the specified memory block in the original form if the ECL entry index is in the first state that indicates that there is no writing error in the specified memory block. If the ECL entry index is in the second state that indicates that there is a single writing error in the specified memory block, the target data is written into the data bit block 112 of the specified memory block in an altered form that is derived from the target data, which can be, for example, the complement of the original target data. If the ECL entry index is not in the first state or in the second state and an ECL entry within the ECL entry block 120 is associated with the specified memory block, the target data is converted into an alternate format which, after error correction using the contents of the mapped-to ECL entry within the ECL entry block 120, reproduces the original target data. The contents of the mapped-to ECL entry, and specifically, the data in the recovery bits of the mapped-to ECL entry, are appropriately changed during this data writing step.

Referring to step 740, the data written into the data bit block 112 of the specified memory block is read (with appropriate error correction using the contents of any mapped-to ECL entry as applicable) and verified against the original target data.

Referring to step 745, the ECL controller 140 or any applicable program running on a central processing unit (CPU) determines whether there is a writing error in storing the target data in the specified memory block. If the data that is read from the data bit block 112, the corresponding pointer bit block 114, and any mapped-to ECL entry, if present, matches the original target data, there is no writing error. The process flow continues to step 790, and a signal for a successful write complete can be generated by the ECL controller or by the program.

If the data that is read from the data bit block 112, the corresponding pointer bit block 114, and any mapped-to ECL entry, if present, does not match the original target data, there is at least one writing error. If the writing error can be corrected without resorting to the ECL entry block 120, for example, because there is only one writing error in total in the data bit block 112 of the specified memory block, the ECL entry index in the corresponding pointer bit block is appropriately changed and another attempt is made to correctly write the target data in the specified memory block. If this attempt is successful, the process flow continues to step 790, and a signal for a successful write complete can be generated by the ECL controller or by the program.

If the writing error can be corrected without resorting to the ECL entry block 120, for example, because there are multiple writing errors in total in the data bit block 112, the process flow continues to step 755. The total number of writing errors in the data bit block 112 is herein referred to as (k+1). The previously known number of errors in the data bit block 112 is a number less than (k+1), and is a number between, and including, 0 and k. By the end of step 745, detection of at least one new writing error is completed.

In the second stage of the second flow chart 700, an available ECL entry for correcting the writing error in the specified memory block is located within the ECL entry block 120. The available ECL entry is located among at least one subset of ECL entries configured to provide error correction for a same number of bits as, or a greater number of bits than, a total number of write errors (k+1) in the error-containing memory block, i.e., the specified memory block.

Whether an ECL entry to correct at least (k+1) writing errors is available can be determined at step 755, which performs the same operation as step 655 of the first flow chart 600.

If no available ECL entry can be found after searching the entirety of entries in the ECL entry block 120, the process flow proceeds to step 799. A signal indicating impossibility of error correction is generated and sent to an appropriate device such as a central processing unit (CPU).

If an available ECL entry is found, the process flow proceeds to step 760, which performs the same operations as step 660 of the first flow chart 600

Referring to step 770, the new ECL entry among the subset of ECL entries configured to correct at least (k+1) writing errors is allocated to correct the writing error in the specified memory block that has been found to contain at least one new writing error. As discussed above, the subset of ECL entries configured to correct at least (k+1) writing errors can be the subset of ECL entries configured to correct (k+1) writing errors or the subset of ECL entries configured to correct (k+j) writing errors depending on the presence of a new or preexisting "available ECL entry" capable of correcting the (k+1) writing errors in the specified memory block.

Specifically, the contents of the new ECL entry is changed to encode information necessary to error-correct the raw data stored in the data bit block 112 of the specified memory block. For example, the contents of the new ECL entry can include repartition information and appropriate flip bits for the data bit block 112, which are necessary to provide error correction employing the SAFER method. The repartition information includes a partition counter and partition fields employed in the SAFER method.

Referring to step 780, the ECL entry index for the pointer bit block 114 of the specified memory block is changed to reference the new ECL entry, for example, by storing a value that is equal to the sum of 2 and the address of the new ECL entry.

The process flow can then proceed to step 730 to confirm that the target data can be correctly written in the selected memory block employing the new error correction scheme as embodied in the pointer bit block 114 and the new ECL entry.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of correcting errors in a memory device comprising:
providing a memory device including at least a plurality of memory blocks and an error correction logic (ECL) entry block including a set of error correction logic (ECL) entries, wherein said set of ECL entries includes a plurality of subsets of ECL entries, and each subset of ECL entries is configured to provide error correction for a different number of bits per memory block in one or more of said plurality of memory blocks, and each of said plurality of memory is configured to store a pointer to an ECL entry within said ECL block;
detecting a writing error in an error-containing memory block among said plurality of memory blocks;
locating an available ECL entry in said ECL entry block; and
storing an address of said available ECL entry in a pointer of said memory block and storing information for correcting all write errors in said error-containing memory block in said available ECL entry,
wherein said ECL entry block includes a plurality of at least one occupancy bit, wherein each of said plurality of at least one occupancy bit is configured to indicate availability of a corresponding ECL entry for storing information for correcting write errors in a memory block.

2. The method of claim 1, wherein said available ECL entry is located among at least one subset of ECL entries configured to provide error correction for a same number of bits as, or a greater number of bits than, a total number of write errors in said error-containing memory block.

3. The method of claim 1, wherein a total bit size of an ECL entry is different for each subset of ECL entries within said set of ECL entries.

4. The method of claim 3, wherein said total bit size is a strictly increasing function of a total number of bits that an ECL entry is configured to correct.

5. The method of claim 1, wherein said plurality of subsets of ECL entries includes a first subset of ECL entries and a last subset of at least one ECL entry, wherein each ECL entry in said first subset is configured to provide error correction for two bits in a memory block, and each ECL entry in said last subset is configured to provide error correction for N bits in a memory block, wherein N is an integer greater than 2.

6. The method of claim 5, wherein N is greater than 3, and said plurality of subsets of ECL entries includes said first subset, said last subset, and at least one i-th subset of ECL entries for a set of at least one number i greater than 1 and less than (N−1), wherein each ECL entry in said i-th subset is configured to provide error correction for a total number of bits greater than 2 and less than N.

7. The method of claim 1, wherein a total number of ECL entries in each subset of ECL entries is a monotonically decreasing function of a total number of bits an ECL entry in each subset is configured to correct.

8. The method of claim 1, wherein said ECL entry block is partitioned into a plurality of subblocks each including one of said plurality of subsets of ECL entries, wherein a number of total bits in an ECL entry is the same within each subblock and is different from a number of total bits in an ECL entry in any different subblock.

9. The method of claim 1, wherein each of said plurality of memory includes first bits for storing data and second bits for storing a pointer to an ECL entry within said ECL block, and each of said plurality of at least one occupancy bit is a single bit that indicates whether said each ECL entry currently stores data for correcting information in first bits in said corresponding memory block.

10. The method of claim 1, wherein each of said plurality of at least one occupancy bit is a plurality of bits indicating how many of said plurality of memory blocks include writing errors that can be corrected by employing information stored in said each ECL entry.

11. The method of claim 1, wherein each of said plurality of memory includes first bits for storing data and second bits for storing a pointer to an ECL entry within said ECL block, and said information includes at least one bit pointer that points to at least one individual error bit within said first bits.

12. The method of claim 1, wherein said information includes a partition counter and partition fields employed in a Stuck-At-Fault Error Recovery (SAFER) method.

13. The method of claim 1, further comprising an error correction entry (ECL) mapper that includes information on location of each subset of ECL entries within said ECL entry block.

14. The method of claim 1, wherein said available ECL entry is selected from within a subset of ECL entries configured to provide the least bits of error correction among said at least one subset of ECL entries.

15. A memory device comprising:
a plurality of memory blocks, wherein each of said plurality of memory blocks include first bits for storing data and second bits for storing a pointer to an ECL entry within said ECL block; and
an error correction logic (ECL) entry block including a set of error correction logic (ECL) entries, wherein said set of ECL entries includes a plurality of subsets of ECL entries, and each subset of ECL entries is configured to provide error correction for a different number of bits per memory block in one or more of said plurality of memory blocks, and each of said plurality of memory is configured to store a pointer to an ECL entry within said ECL block, wherein said ECL entry block includes a plurality of at least one occupancy bit, wherein each of said plurality of at least one occupancy bit is configured to indicate availability of a corresponding ECL entry for storing information for correcting write errors in a memory block.

16. The memory device of claim 15, wherein a total bit size of an ECL entry is different for each subset of ECL entries within said set of ECL entries.

17. The memory device of claim 16, wherein said total bit size is a strictly increasing function of a total number of bits that an ECL entry is configured to correct.

18. The memory device of claim 15, wherein said plurality of subsets of ECL entries includes a first subset of ECL entries and a last subset of at least one ECL entry, wherein each ECL entry in said first subset is configured to provide error correction for two bits in a memory block, and each ECL entry in said last subset is configured to provide error correction for N bits in a memory block, wherein N is greater than 2.

19. The memory device of claim 18, wherein N is greater than 3, and said plurality of subsets of ECL entries includes said first subset, said last subset, and at least one i-th subset of ECL entries for a set of at least one number i greater than 1 and less than (N−1), wherein each ECL entry in said i-th subset is configured to provide error correction for a total number of bits greater than 2 and less than N.

20. The memory device of claim 15, wherein a total number of ECL entries in each subset of ECL entries is a monotonically decreasing function of a total number of bits an ECL entry in each subset is configured to correct.

21. The memory device of claim 15, wherein said ECL entry block is partitioned into a plurality of subblocks each including one of said plurality of subsets of ECL entries, wherein a number of total bits in an ECL entry is the same within each subblock and is different from a number of total bits in an ECL entry in any different subblock.

22. The memory device of claim 15, further comprising an ECL controller configured:
- to detect a writing error in an error-containing memory block among said plurality of memory blocks; and
- to locate an available ECL entry among at least one subset of ECL entries configured to provide error correction for a same number of bits as, or a greater number of bits than, a total number of write errors in said error-containing memory block.

23. The memory device of claim 22, wherein said ECL controller is further configured to store an address of said available ECL entry in a pointer of said memory block and to store information for correcting all write errors in said error-containing memory block in said available ECL entry.

24. A method of correcting errors in a memory device comprising:
- providing a memory device including at least a plurality of memory blocks and an error correction logic (ECL) entry block including a set of error correction logic (ECL) entries, wherein said set of ECL entries includes a plurality of subsets of ECL entries, and each subset of ECL entries is configured to provide error correction for a different number of bits per memory block in one or more of said plurality of memory blocks, and each of said plurality of memory is configured to store a pointer to an ECL entry within said ECL block;
- detecting a writing error in an error-containing memory block among said plurality of memory blocks;
- locating an available ECL entry in said ECL entry block;
- storing an address of said available ECL entry in a pointer of said memory block and storing information for correcting all write errors in said error-containing memory block in said available ECL entry;
- causing multiple memory blocks having writing errors in a same set of faulty bit positions to share a same error correction logic in a same ECL entry upon determination that there exists an already allocated ECL entry which corrects errors in said same set of faulty bit positions as with a newly detected error-containing memory block that includes at least one new writing error.

25. The memory device of claim 15, wherein said memory device is configured to cause multiple memory blocks having writing errors in a same set of faulty bit positions to share a same error correction logic in a same ECL entry upon determination that there exists an already allocated ECL entry which corrects errors in said same set of faulty bit positions as with a newly detected error-containing memory block that includes at least one new writing error.

* * * * *